(12) United States Patent
Chen et al.

(10) Patent No.: US 10,325,854 B2
(45) Date of Patent: Jun. 18, 2019

(54) INTERPOSER AND SEMICONDUCTOR PACKAGE DEVICE

(71) Applicant: Advanced Semiconductor Engineering, Inc., Kaohsiung (TW)

(72) Inventors: Kun-Ming Chen, Kaohsiung (TW); Yuan-Feng Chiang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/652,821

(22) Filed: Jul. 18, 2017

(65) Prior Publication Data

US 2019/0027441 A1  Jan. 24, 2019

(51) Int. Cl.
| | |
|---|---|
| *H01L 23/538* | (2006.01) |
| *H01L 21/48* | (2006.01) |
| *H01L 25/10* | (2006.01) |
| *H01L 25/00* | (2006.01) |

(52) U.S. Cl.
CPC ........ *H01L 23/5386* (2013.01); *H01L 21/486* (2013.01); *H01L 21/4853* (2013.01); *H01L 21/4857* (2013.01); *H01L 23/5383* (2013.01); *H01L 23/5384* (2013.01); *H01L 23/5389* (2013.01); *H01L 25/105* (2013.01); *H01L 25/50* (2013.01); *H01L 2225/1035* (2013.01); *H01L 2225/1058* (2013.01)

(58) Field of Classification Search
CPC . H01L 23/5386; H01L 21/4857; H01L 25/50; H01L 21/4853; H01L 21/486; H01L 23/5389; H01L 25/105; H01L 23/5384; H01L 23/5383; H01L 2225/1058; H01L 2225/1035; H01L 23/498–49894; H01L 23/538–5389; H01L 23/28–3192; H01L 21/56–568; H01L 21/76898; H01L 23/481
See application file for complete search history.

(56) References Cited

U.S. PATENT DOCUMENTS

| | | | |
|---|---|---|---|
| 9,209,110 B2 | 12/2015 | Alvarado et al. | |
| 9,502,390 B2 | 11/2016 | Caskey et al. | |
| 2017/0103942 A1* | 4/2017 | Oi | H01L 24/13 |
| 2017/0229404 A1* | 8/2017 | Yu | H01L 24/13 |

* cited by examiner

*Primary Examiner* — Marcos D. Pizarro
*Assistant Examiner* — Nelson Garces
(74) *Attorney, Agent, or Firm* — Foley & Lardner LLP; Cliff Z. Liu

(57) ABSTRACT

An interposer comprises a first conductive wire having a first terminal and a second terminal, a first oxide layer, and an encapsulant. The first oxide layer covers the first conductive wire and exposes the first terminal and the second terminal of the first conductive wire. The encapsulant covers the first oxide layer and exposes the first terminal and the second terminal of the first conductive wire.

20 Claims, 23 Drawing Sheets

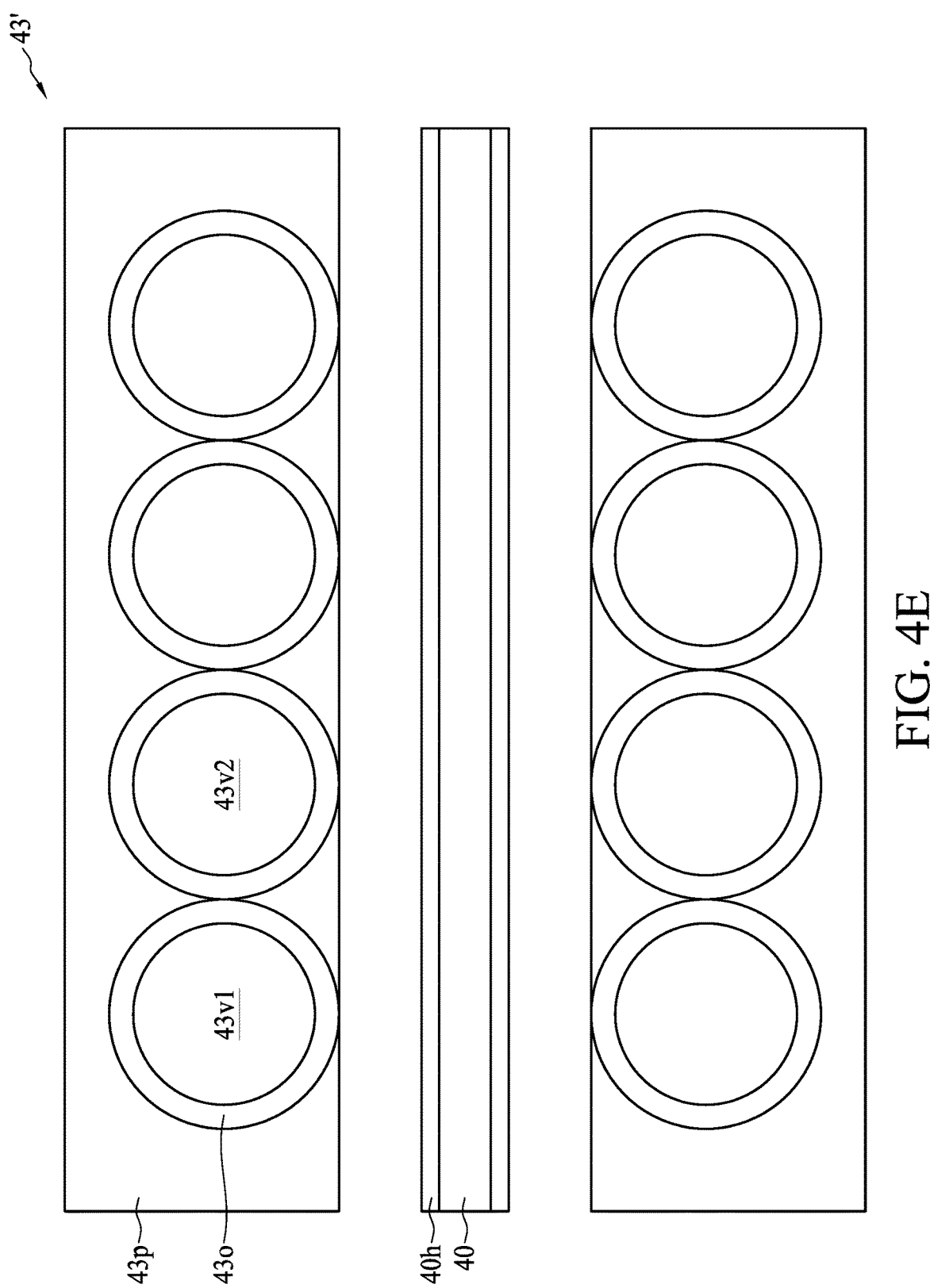

INTERPOSER AND SEMICONDUCTOR PACKAGE DEVICE

BACKGROUND

1. Technical Field

The present disclosure relates generally to a semiconductor package device and a method of manufacturing the same. More particularly, the present disclosure relates to a semiconductor package device including a fan-out structure and a method of manufacturing the same.

2. Description of the Related Art

In a comparative semiconductor package device with a fan-out structure, one or more semiconductor devices (e.g., processing unit, memory, etc.) may be attached to a substrate (e.g., a ball grid array (BGA) substrate) by way of an interposer, where through-silicon vias (TSVs) or conductive pillars in the interposer provide electrical connection between the semiconductor devices and the substrate. However, due to the limitation of the manufacturing process, it is difficult to form a conductive pillar with a height of more than 200 micrometer ($\mu$m) in a single electroplating operation. Therefore, it takes at least two electroplating processes to form a relative tall conductive pillar, which increase the manufacturing cost and time. In addition, a thick photoresist is used to form a tall conductive pillar, which also increases the manufacturing cost and introduces reliability issues.

SUMMARY

In one aspect according to some embodiments, an interposer comprises a first conductive wire having a first terminal and a second terminal, a first oxide layer, and an encapsulant. The first oxide layer covers the first conductive wire and exposes the first terminal and the second terminal of the first conductive wire. The encapsulant covers the first oxide layer and exposes the first terminal and the second terminal of the first conductive wire.

In another aspect according to some embodiments, a semiconductor package device comprises a substrate, an electronic component on the substrate, and an interposer between the substrate and the electronic component. The interposer electrically connects the electronic component with the substrate. The interposer comprises a plurality of conductive wires electrically insulated from one another and a package body encapsulating the plurality of conductive wires and exposing a portion of each of the plurality of conductive wires. The package body has a first surface and a second surface opposite to the first surface. At least one of the plurality of conductive wires is substantially perpendicular to the first surface of the package body.

In yet another aspect according to some embodiments, a method for manufacturing an interposer comprises: coiling a conductive wire around a carrier to form a conductive coil; and forming an encapsulant covering the conductive coil to form a coil unit.

BRIEF DESCRIPTION OF THE DRAWINGS

Aspects of the present disclosure are best understood from the following detailed description when read with the accompanying figures. It is noted that various features may not be drawn to scale, and the dimensions of the various features may be arbitrarily increased or reduced for clarity of discussion.

FIG. 4B' illustrates a three-dimensional perspective view of the semiconductor package device as shown in FIG. 4B in accordance with some embodiments of the present disclosure;

FIG. 4D' illustrates a cross-sectional view of the semiconductor package structure as shown in FIG. 4D in accordance with some embodiments of the present disclosure.

FIG. 4E illustrates a method for manufacturing a semiconductor package device at one or more stages in accordance with some embodiments of the present disclosure;

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
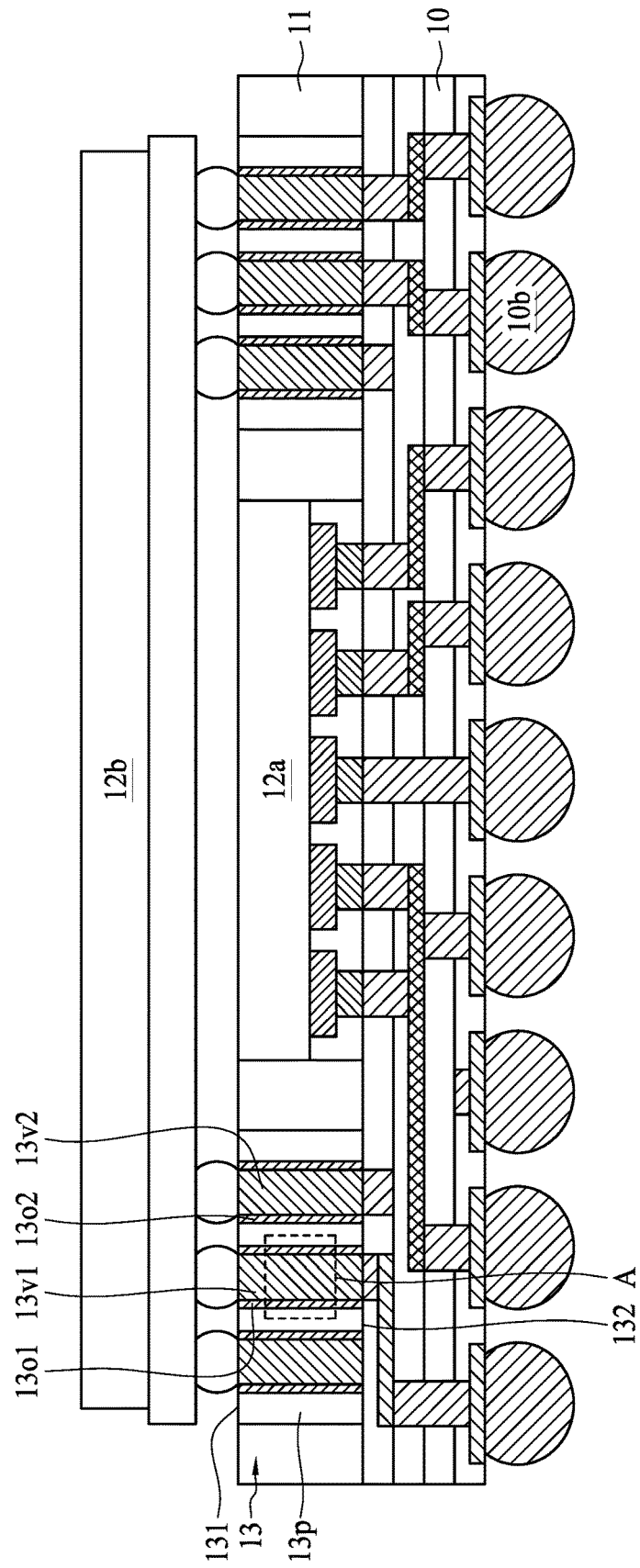
FIG. 1A illustrates a cross-sectional view of a semiconductor package device in accordance with some embodiments of the present disclosure.

FIG. 1A illustrates a cross-sectional view of a semiconductor package device 1 in accordance with some embodiments of the present disclosure. The semiconductor package device 1 includes a substrate 10, a package body 11, one or more electronic components 12a, 12b and an interposer 13.

The substrate 10 may be a flexible substrate or a rigid substrate, depending upon the applications according to various embodiments. In some embodiments, the substrate 10 includes one or more electrical traces disposed therein. In some embodiments, an external contact layer is also formed or disposed on the substrate 10. In some embodiments, the external contact layer includes a ball grid array (BGA). In other embodiments, the external contact layer includes an array such as, but not limited to, a land grid array (LGA) or a pin grid array (PGA). In some embodiments, the external contact layer includes one or more solder balls 10b, which may include lead or are lead-free (e.g., including materials such as alloys of gold and tin solder or alloys of silver and tin solder).

The electronic component 12a is disposed on the substrate 10. The electronic component 12a may be an active component, such as an integrated circuit (IC) chip or a die. For example, the chip or the die may include a semiconductor substrate, one or more integrated circuit devices and one or more overlying interconnection structures therein. The integrated circuit devices may include active devices such as transistors and/or passive devices such resistors, capacitors, inductors, or a combination of two or more thereof. In some embodiments, the electronic component 12a may be an application-specific integrated circuit (ASIC). The electronic component 12a may be electrically connected to the conductive pads on the substrate 10 by way of, e.g., flip-chip or wire-bond techniques.

The interposer 13 is disposed on the substrate 10. The interposer 13 includes one or more conductive wires 13v1, 13v2 and a package body 13p. The conductive wires may be electrically isolated from each other. For example, the conductive wire 13v1 and its adjacent conductive wire 13v2 are electrically isolated from each other. In some embodiments, the periphery of each of the conductive wires 13v1, 13v2 is covered by an oxide layer 13o1, 13o2. The oxide layer 13o1 covering the conductive wire 13v1 may contact its adjacent oxide layer 13o2 covering the conductive wire 13v2. The conductive wire 13v1 and the conductive wire 13v2 are electrically isolated by the oxide layers 13o1, 13o2. In some embodiments, the oxide layers can be omitted, and the conductive wire 13v1 and its adjacent conductive wire 13v2 are spaced apart to provide electrical isolation therebetween. In some embodiments, the conductive wires 13v1, 13v2 may be formed of, or include, e.g., copper (Cu), silver (Ag), aluminum (Al), gold (Au), other suitable metals or alloys, or a combination of two or more thereof. In some embodiments, the oxide layers 13o1, 13o2 may be formed of, or include, e.g., $Cu_xO_y$, $Ag_xO_y$, $Cr_xO_y$, $Al_xO_y$, other metal oxides or other suitable materials, or a combination of two or more thereof.

The package body 13p (also referred to as an encapsulant) covers or encapsulates at least a portion of the oxide layers 13o1, 13o2 or the periphery of the conductive wires 13v1, 13v2. Both terminals (or terminal ends) of each conductive wire 13v1, 13v2 are exposed from the package body 13p. In some embodiments, the package body 13p may include an epoxy resin having fillers, a molding compound (e.g., an epoxy molding compound or other molding compound), a polyimide, a phenolic compound or material, a material with a silicone dispersed therein, or a combination of two or more thereof. In some embodiments, the conductive wires 13v1, 13v2 are substantially perpendicular to a top surface 131 (also referred to as a first surface) or a bottom surface 132 (also referred to as a second surface) of the package body 13p.

In some embodiments, the conductive wires 13v1, 13v2 of the interposer 13 are parts of a bonding wire. By using the bonding wire encapsulated by the package body 13p to form the interposer 13, the electroplating process for forming conductive pillars is eliminated, which would reduce the manufacturing cost and time. In addition, since the interposer 13 is formed by a portion of the bonding wire and the package body 13p, it is streamlined to form an interconnection structure (compared to the conductive pillar) with a thickness greater than, e.g., about 100 μm, about 150 μm, about 200 μm, or about 300 μm.

The package body 11 is disposed on the substrate and covers or encapsulates the electronic component 12a and lateral surfaces of the interposer 13. Both terminals of each conductive wire 13v1, 13v2 are exposed from the package body 11. In some embodiments, the package body 11 may include an epoxy resin having fillers, a molding compound (e.g., an epoxy molding compound or other molding compound), a polyimide, a phenolic compound or material, a material with a silicone dispersed therein, or a combination of two or more thereof.

The electronic component 12b is disposed on the package body 11 and electrically connected with one terminal of each of the conductive wires 13v1, 13v2 that is exposed from the package body 11. Another terminal of each of the conductive wires 13v1, 13v2 that is exposed from the package body 11 is electrically connected to the conductive pads on the substrate 10. Thus, the electronic component 12b is electrically connected to the substrate 10 through the interposer 13. The electronic component 12b may be an active component, such as an IC chip or a die. For example, the chip or the die may include a semiconductor substrate, one or more integrated circuit devices and one or more overlying interconnection structures therein. The integrated circuit devices may include active devices such as transistors and/or passive devices such resistors, capacitors, inductors, or a combination of two or more thereof. In some embodiments, the electronic component 12*b* may be, e.g., a memory chip.

Figure 1B:
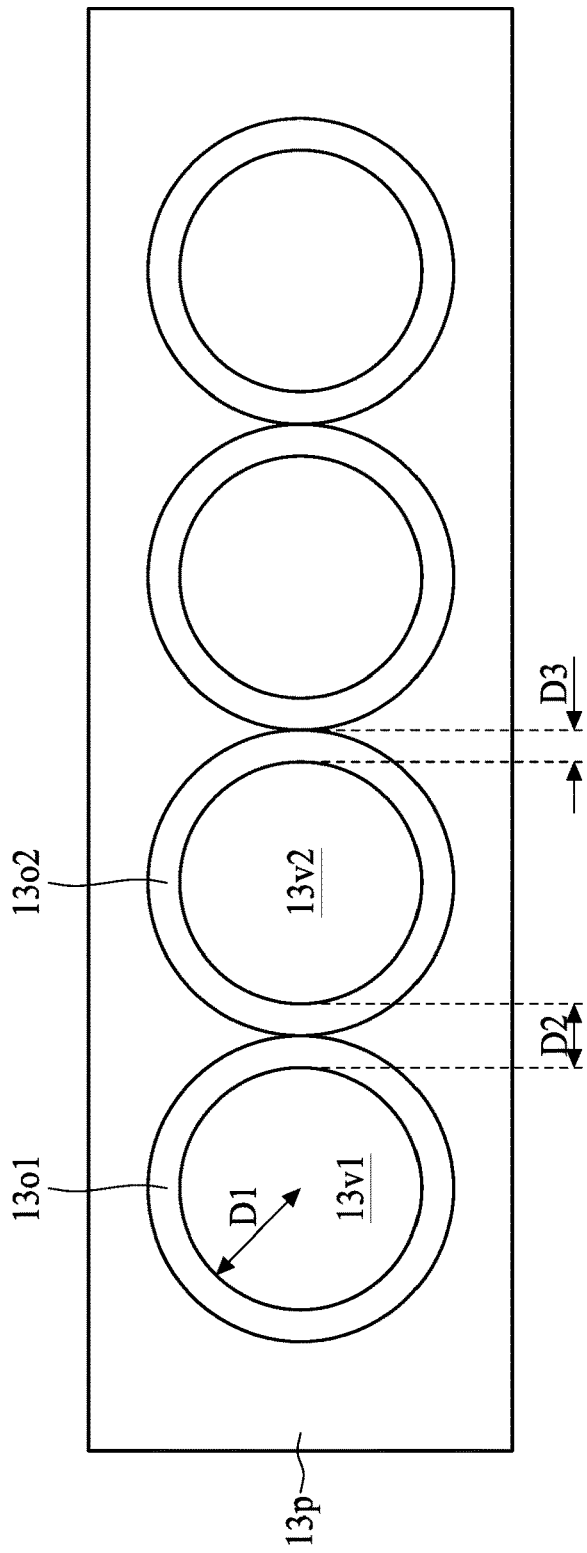
FIG. 1B illustrates a top view of an interposer in accordance with some embodiments of the present disclosure.

FIG. 1B illustrates a top view of the interposer 13 as shown in FIG. 1A in accordance with some embodiments of the present disclosure. As shown in FIG. 1B, the conductive wires 13*v*1, 13*v*2 are surrounded by the oxide layers 13*o*1, 13*o*2 and the package body 13*p* covers the oxide layers 13*o*1, 13*o*2. The conductive wire 13*v*1 and its adjacent conductive wire 13*v*2 are electrically isolated from each other by the oxide layers 13*o*1, 13*o*2. In some embodiments, the oxide layer 13*o*1 covering the conductive wire 13*v*1 may contact its adjacent oxide layer 13*o*2 covering the conductive wire 13*v*2. In some embodiments, the oxide layers can be omitted, and the conductive wire 13*v*1 and its adjacent conductive wire 13*v*2 are spaced apart to provide electrical isolation therebetween. In some embodiments, a radius D1 of the conductive wires 13*v*1, 13*v*2 is in a range from about 1 μm to about 1000 μm, from about 5 μm to about 750 μm, or from about 10 μm to about 500 μm. In some embodiments, a thickness D2 of the oxide layers 13*o*1, 13*o*2 is in a range from about 10 nanometer (nm) to about 50 from about 5 nm to about 75 or from about 1 nm to about 100 Therefore, a distance (also referred to as a pitch) D2 between two adjacent conductive wires 13*v*1, 13*v*2 is in a range from about 20 nm to about 100 μm, from about 10 nm to about 150 μm, or from about 2 nm to about 200 μm. In at least some embodiments, the interposer 13 has a minimum pitch of about 20 nm, which is suitable for fine-pitch applications.

Figure 1C:
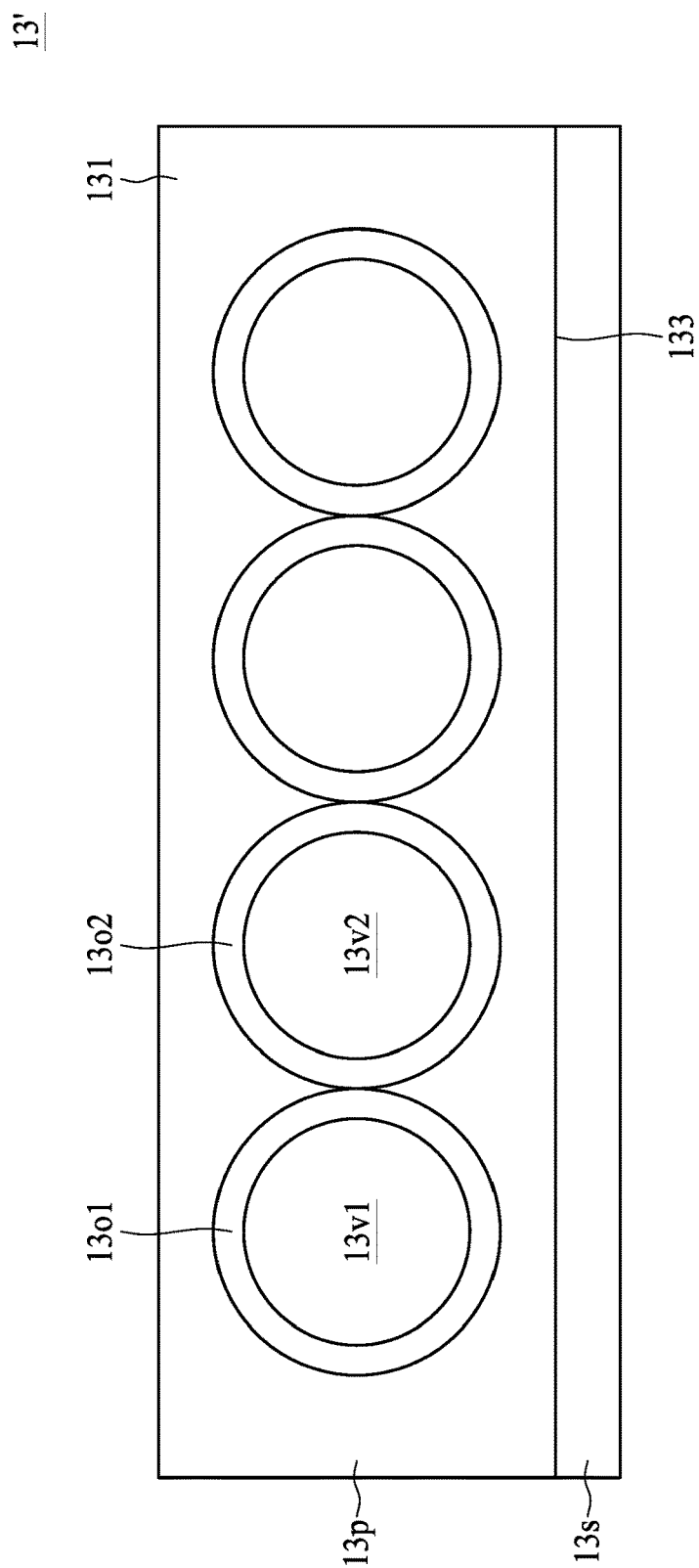
FIG. 1C illustrates a top view of an interposer in accordance with some embodiments of the present disclosure.

FIG. 1C illustrates a top view of the interposer 13' in accordance with some embodiments of the present disclosure. The interposer 13' is similar to the interposer 13 shown in FIG. 1B, except that the interposer 13' further includes a substrate 13*s* on a lateral surface 133 of the package body 13*p* (which is extending between the top surface 131 and the bottom surface 132 of the package body 13*p*). In some embodiments, the substrate 13*s* may strengthen the interposer 13'. In some embodiments, the substrate 13*s* may be, e.g., a silicon substrate, a glass substrate, a ceramic substrate, an organic substrate, a metal plate or other suitable carriers.

Figure 1D:
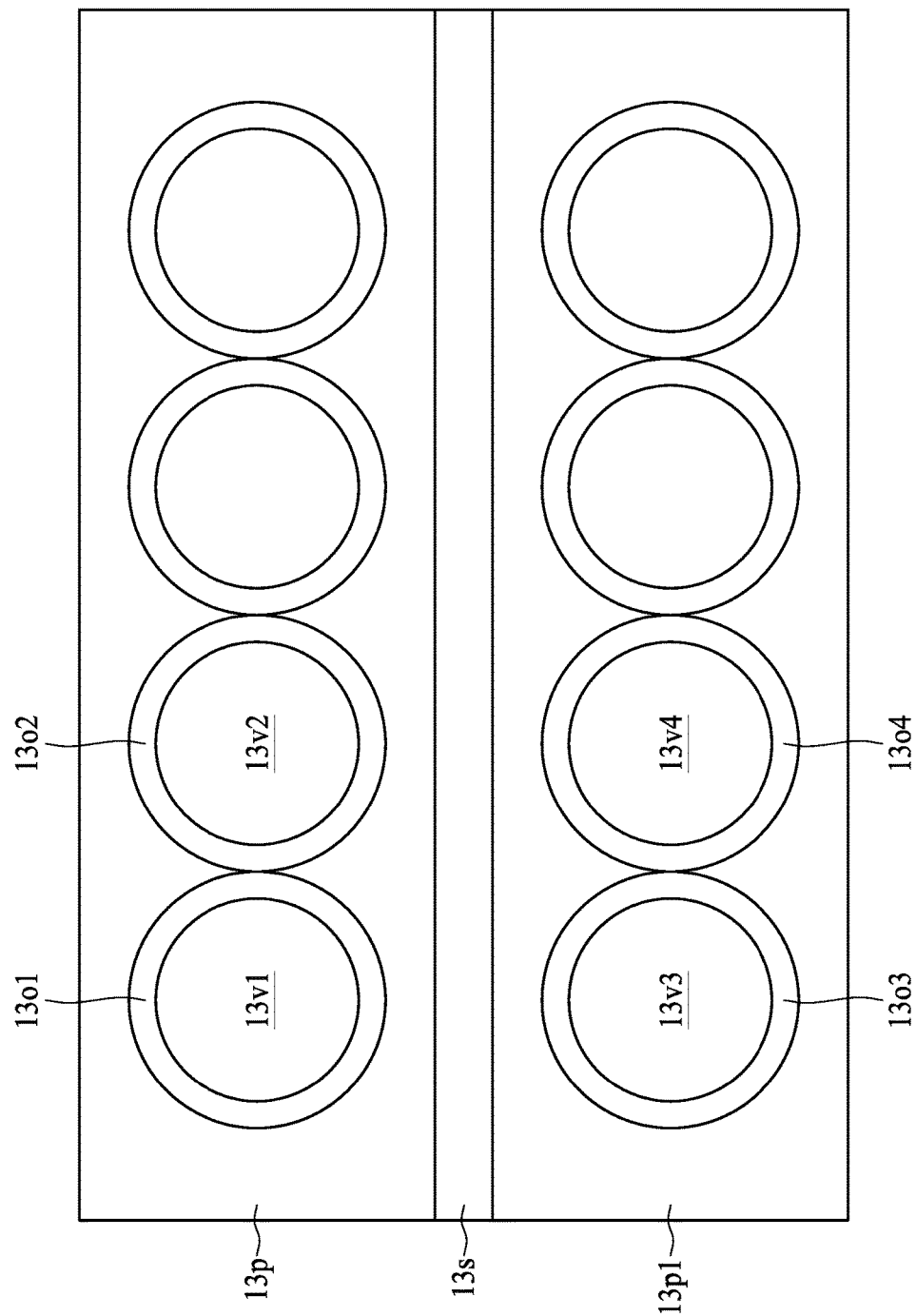
FIG. 1D illustrates a top view of an interposer in accordance with some embodiments of the present disclosure.

FIG. 1D illustrates a top view of the interposer 13" in accordance with some embodiments of the present disclosure. The interposer 13" is similar to the interposer 13' shown in FIG. 1C, except that the interposer 13" is a double-sided interposer while the interposer 13' is a single-sided interposer. For example, the interposer 13" further includes conductive wires 13*v*3, 13*v*4, oxide layers 13*o*3, 13*o*4 and a package body 13*p*1 on another side of the substrate 13*s*. In some embodiments, the structure defined by the conductive wires 13*v*3, 13*v*4, the oxide layers 13*o*3, 13*o*4 and the package body 13*p*1 may be the same as or similar to the structure defined by the conductive wires 13*v*1, 13*v*2, the oxide layers 13*o*1, 13*o*2 and the package body 13*p*.

Figure 1E:
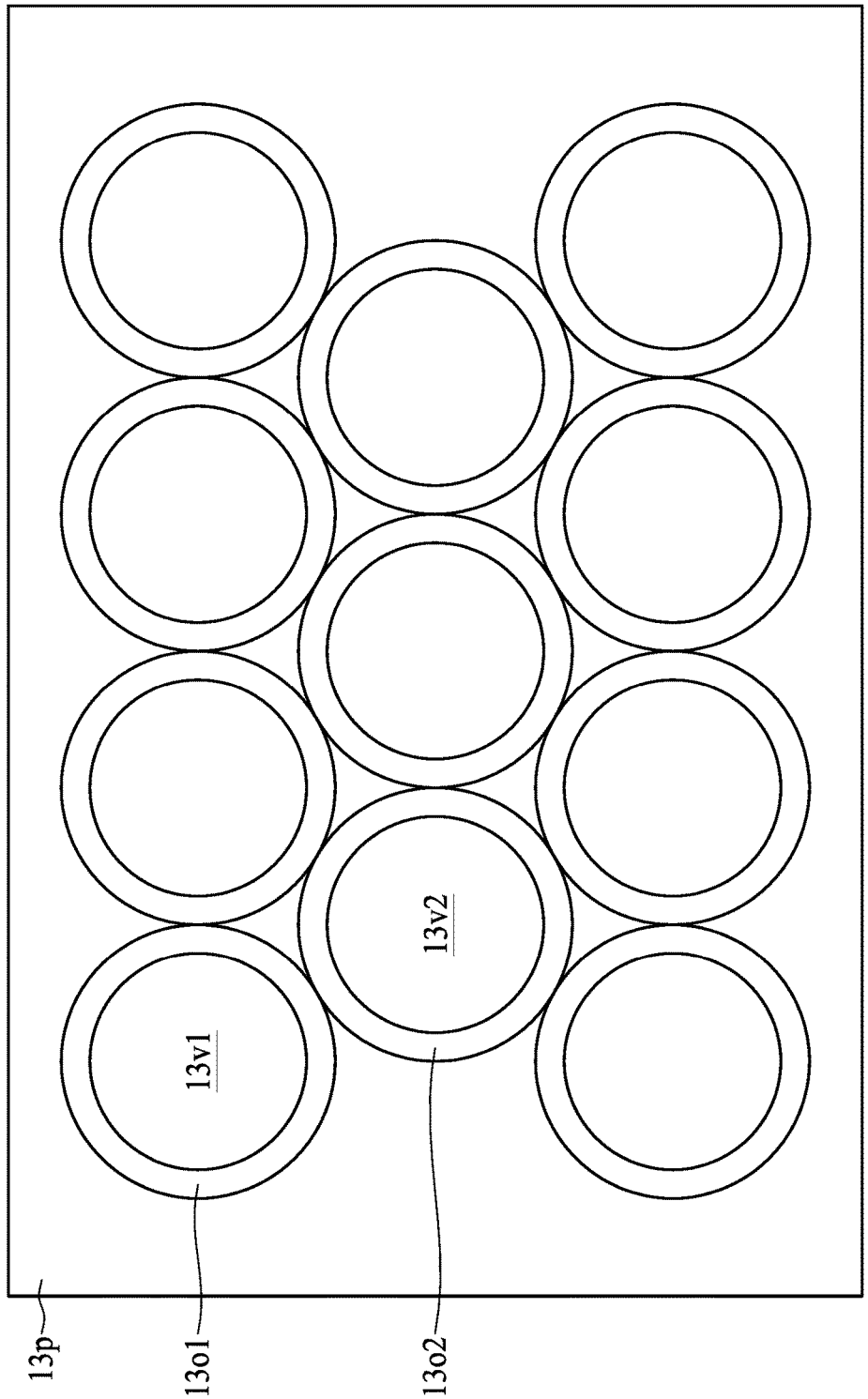
FIG. 1E illustrates a top view of an interposer in accordance with some embodiments of the present disclosure.

FIG. 1E illustrates a top view of the interposer 13''' in accordance with some embodiments of the present disclosure. The interposer 13''' is similar to the interposer 13 shown in FIG. 1B, except that the interposer 13''' includes three rows of conductive wires 13*v*1, 13*v*2. For example, the conductive wire 13*v*1 is at the first row and the conductive wire 13*v*2 is at the second row. In some embodiments, the number of the rows of the conductive wires may be an arbitrary integer, depending on design specifications according to various embodiments.

Figure 1F:
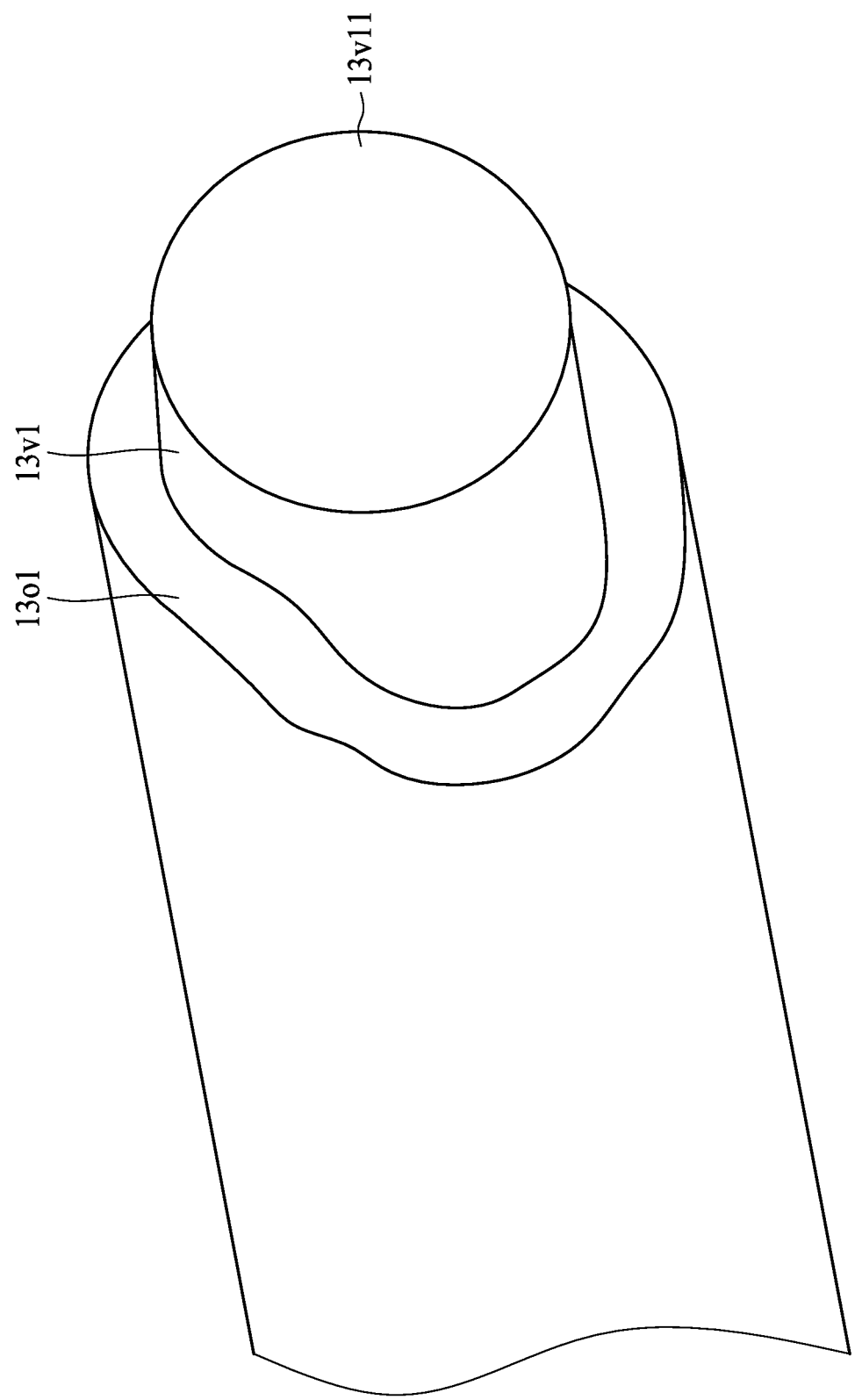
FIG. 1F illustrates an enlarged view of a conductive wire and an oxide layer as shown in FIG. 1A in accordance with some embodiments of the present disclosure.

FIG. 1F illustrates an enlarged view of the conductive wire 13*v*1 and the oxide layer 13*o*1 as shown in FIG. 1A in accordance with some embodiments of the present disclosure. As shown in FIG. 1F, the periphery of the conductive layer 13*v*1 is encapsulated or covered by the oxide layer 13*o*1 and the terminal 13*v*11 of the conductive wire 13*v*1 is exposed from the oxide layer 13*o*1.

FIGS. 2A, 2B, 2C and 2D illustrate various stages of a method for manufacturing a semiconductor package device in accordance with some embodiments of the present disclosure.

Figure 2A:
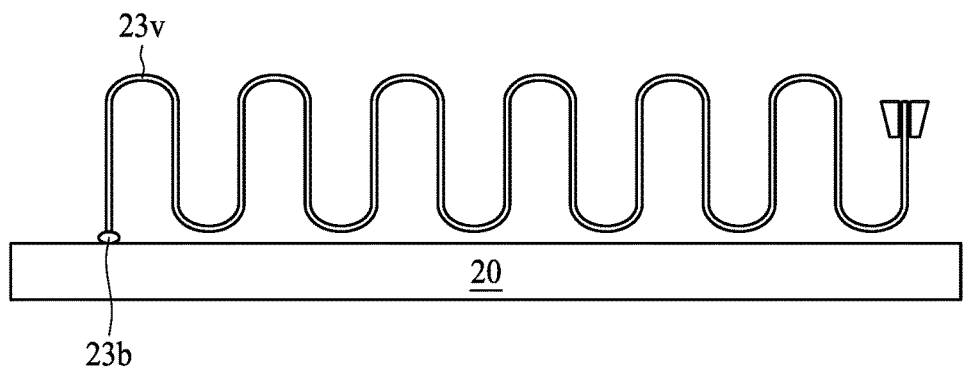
FIG. 2A illustrates a method for manufacturing a semiconductor package device at one or more stages in accordance with some embodiments of the present disclosure.

Referring to FIG. 2A, a carrier 20 is provided. In some embodiments, the carrier 20 is a substrate (e.g., a wafer substrate). The substrate may be a silicon substrate, a glass substrate, a ceramic substrate, an organic substrate, a metal plate or other suitable carriers.

A bonding wire 23*v* is then coupled to a surface (e.g., top surface) of the carrier 20. The bonding wire 23*v* may be laid out one or more times up, down, and sideways along the surface of the carrier 20. In some implementations, the bonding wire 23*v* is coupled to the carrier 20 through a wire ball 23*b*. In some implementations, the wire ball 23*b* is a melted wire bond. In some embodiments, the bonding wire 23*v* is referred to as a conductive coil that forms a coil unit. In some embodiments, the bonding wire 23*v* comprises an insulation lining thereon.

Figure 2B:
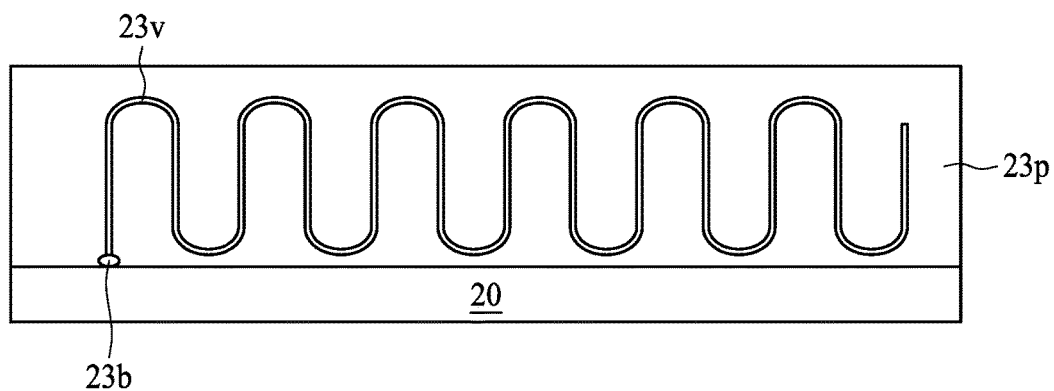
FIG. 2B illustrates a method for manufacturing a semiconductor package device at one or more stages in accordance with some embodiments of the present disclosure.

Referring to FIG. 2B, a package body 23*p* is formed on the carrier 20 to cover or encapsulate the bonding wire 23*v*. In some embodiments, the package body 23*p* may include an epoxy resin having fillers, a molding compound (e.g., an epoxy molding compound or other molding compound), a polyimide, a phenolic compound or material, a material with a silicone dispersed therein, or a combination of two or more thereof.

Figure 2C:
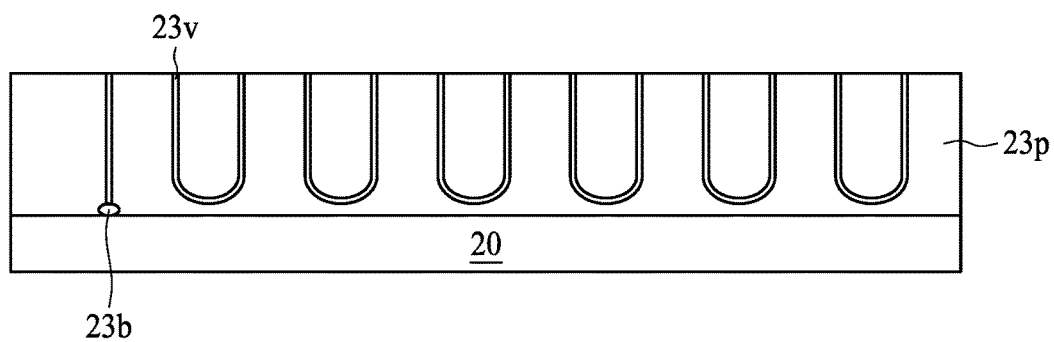
FIG. 2C illustrates a method for manufacturing a semiconductor package device at one or more stages in accordance with some embodiments of the present disclosure.

Referring to FIG. 2C, a portion of the package body 23*p* and/or one or more portions (e.g., a top portion) of the bonding wire 23*v* are removed. In some embodiments, the removing operation can be achieved by, e.g., grinding and/or polishing portions of the package body 23*p* and/or portions of the bonding wire 23*v* to be exposed.

Figure 2D:
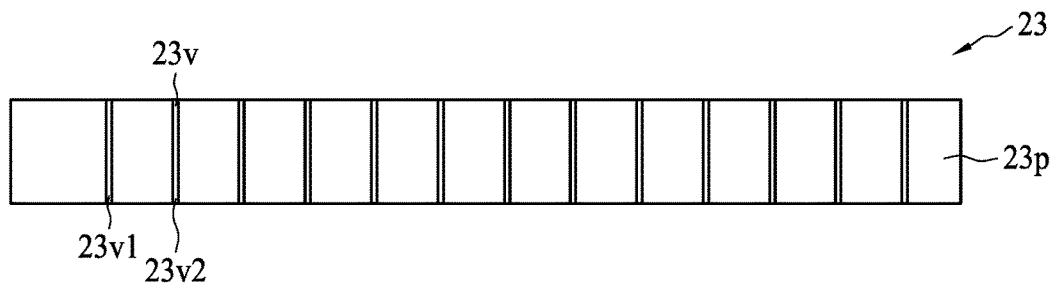
FIG. 2D illustrates a method for manufacturing a semiconductor package device at one or more stages in accordance with some embodiments of the present disclosure.

Referring to FIG. 2D, the carrier 20, a portion (e.g., bottom portion) of the package body 23*p*, a portion of the bonding wire 23 and the wire ball 23*b* are removed. In some embodiments, the removing operation can be achieved by, e.g., grinding and/or polishing the carrier 20, portions of the package body 23*p* and a portion of the bonding wire 23. The structure shown in FIG. 2D is configured to operate as an interposer 23 including one or more separated conductive wires 23*v*1, 23*v*2 encapsulated by the remaining portion of the package body 23. In some embodiments, the conductive wires are referred to as subunits.

In the operation of forming the package body 23*p* as shown in FIG. 2B, the bonding wire 23*v* may become distorted (or even broken) during a process of injecting the molding compound on the carrier 20. Therefore, even if the bonding wire 23*v* is substantially perpendicular to the surface of the carrier 20 in FIG. 2A, the separated conductive wires 23*v*1, 23*v*2 may not be substantially perpendicular to the surface of the carrier 20 after forming the package body 23*p*. For example, the conductive wires 23*v*1, 23*v*2 may have different orientation (e.g., non-vertical, diagonal, or horizontal). In addition, at least some portions of the conductive wires 23*v*1, 23*v*2 may be non-linear. In addition, because the bonding wire 23*v* is relatively thin, the height (e.g., a distance between the surface of the carrier 20 and the sidewall of the bonding wire 23*v*) of the bonding wire 23*v* may be specified within a range.

FIGS. 3A, 3B, 3C and 3D illustrate various stages of a method for manufacturing a semiconductor package device in accordance with some embodiments of the present disclosure.

Figure 3A:
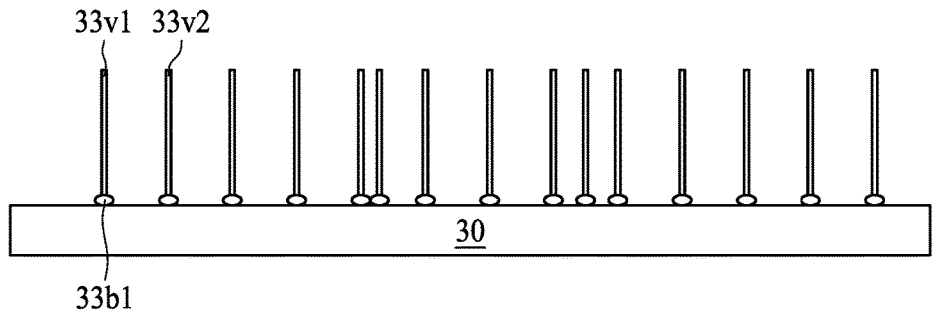
FIG. 3A illustrates a method for manufacturing a semiconductor package device at one or more stages in accordance with some embodiments of the present disclosure.

Referring to FIG. 3A, a carrier 30 is provided. In some embodiments, the carrier 30 is a substrate (e.g., a wafer substrate). The substrate may be a silicon substrate, a glass substrate, a ceramic substrate, an organic substrate, a metal plate or other suitable carriers.

A first bonding wire 33v1 is coupled to a surface (e.g., top surface) of the carrier 20. In some implementations, the first bonding wire 33v1 is coupled to the carrier 20 through a first wire ball 33b1. In some implementations, the first wire ball 33b1 is a melted bonding wire. In some embodiments, the first bonding wire 33v1 is drawn out from a device or machine that provides a bonding wire. Several bonding wires (e.g., 33v2) may be then coupled to the surface of the carrier 20 and are separated from each other. For example, the first bonding wire 33v1 and its adjacent bonding wire 33v2 are separated from each other.

Figure 3B:
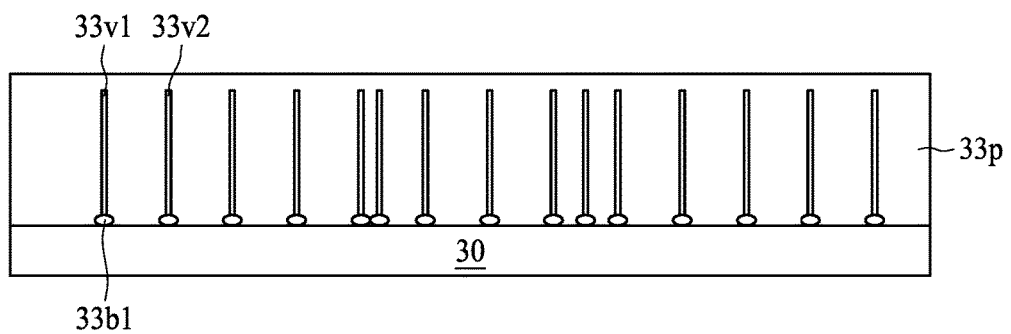
FIG. 3B illustrates a method for manufacturing a semiconductor package device at one or more stages in accordance with some embodiments of the present disclosure.

Referring to FIG. 3B, a package body 33p is formed on the carrier 30 to cover or encapsulate the bonding wires 33v1, 33v2. In some embodiments, the package body 33p may include an epoxy resin having fillers, a molding compound (e.g., an epoxy molding compound or other molding compound), a polyimide, a phenolic compound or material, a material with a silicone dispersed therein, or a combination of two or more thereof.

Figure 3C:
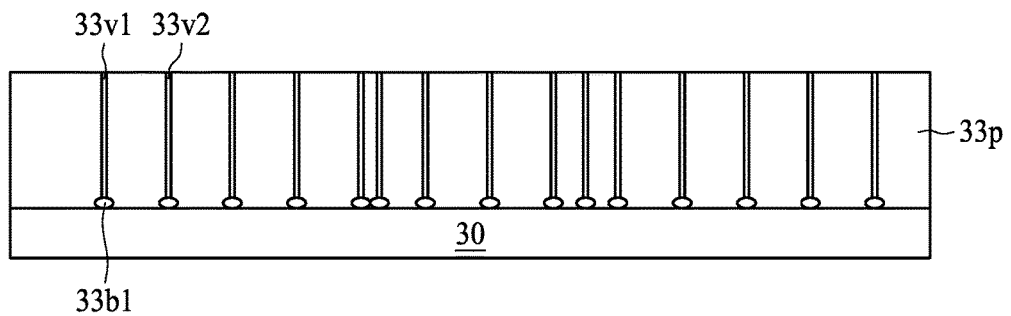
FIG. 3C illustrates a method for manufacturing a semiconductor package device at one or more stages in accordance with some embodiments of the present disclosure.

Referring to FIG. 3C, a portion of the package body 33p and/or one or more portions (e.g., a top portion) of the bonding wires 33v1, 33v2 are removed. In some embodiments, the removing operation the can be achieved by, e.g., grinding and/or polishing portions of the package body 33p and/or portions of the bonding wires 33v1, 33v2 to be exposed.

Figure 3D:
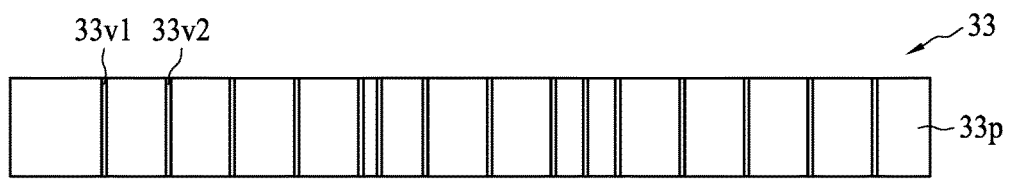
FIG. 3D illustrates a method for manufacturing a semiconductor package device at one or more stages in accordance with some embodiments of the present disclosure.

Referring to FIG. 3D, the carrier 30, a portion (e.g., bottom portion) of the package body 33p, a portion of the bonding wires 33v1, 33v2 and the wire ball 33b1 are removed. In some embodiments, the removing operation can be achieved by, e.g., grinding and/or polishing the carrier 30, portions of the package body 33p and a portion of the bonding wires 33v1, 33v2. The structure shown in FIG. 3D is configured to operate as an interposer 33 including one or more separated conductive wires 33v1, 33v2 encapsulated by the remaining portion of the package body 33.

Compared with the manufacturing method shown in FIGS. 2A-2D, the manufacturing method shown in FIGS. 3A-3D has an advantage to provide (e.g., form, or fabricate) an interposer with smaller distance (or pitch) between any two of adjacent conductive wires. However, similar to the manufacturing method shown in FIGS. 2A-2D, the bonding wires 33v1, 33v2 may become distorted (or even broken) during a process of injecting the molding compound on the carrier 30 to form the package body 33p. In addition, because the bonding wires 33v1, 33v2 are relatively thin, the height of the bonding wires 33v1, 33v2 may be specified within a range.

FIGS. 4A, 4B, 4C, 4D and 4E illustrate various stages of a method for manufacturing a semiconductor package device in accordance with some embodiments of the present disclosure.

Figure 4A:
FIG. 4A illustrates a method for manufacturing a semiconductor package device at one or more stages in accordance with some embodiments of the present disclosure.

Referring to FIG. 4A, a carrier 40 is provided. In some embodiments, the carrier 40 is a substrate (e.g., a wafer substrate). The substrate may be a silicon substrate, a glass substrate, a ceramic substrate, an organic substrate, a metal plate or other suitable carriers. In some embodiments, the carrier 40 may include a release film 40h thereon.

Figure 4B:
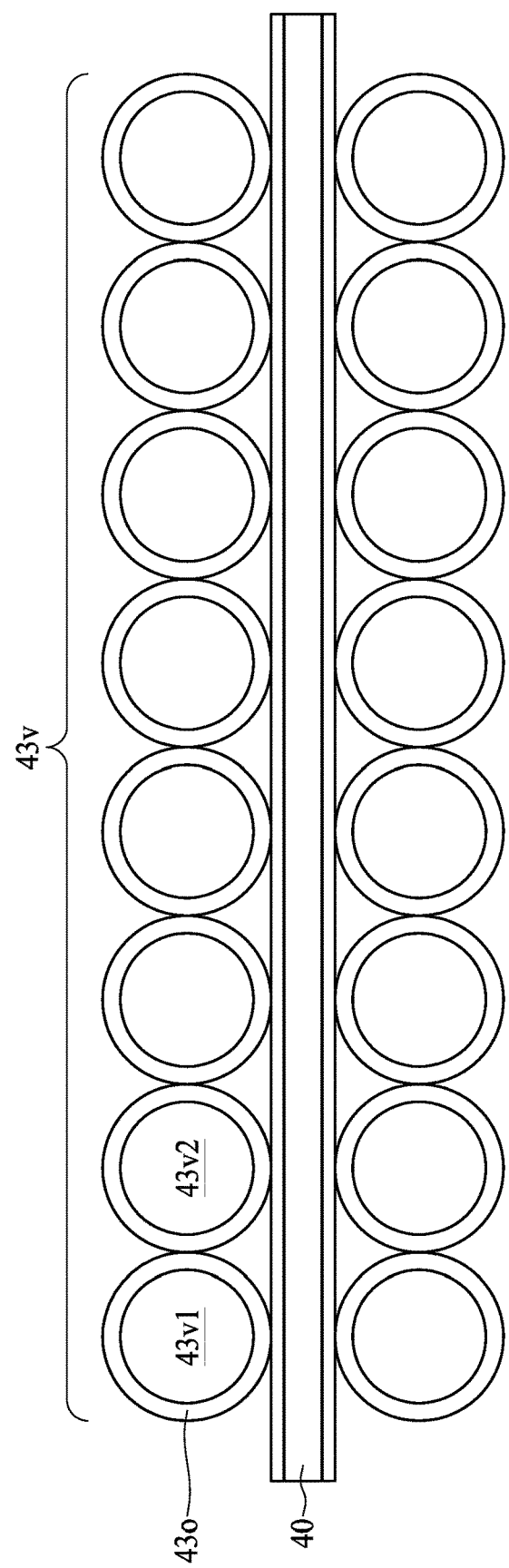
FIG. 4B illustrates a method for manufacturing a semiconductor package device at one or more stages in accordance with some embodiments of the present disclosure.
Figure 4B:
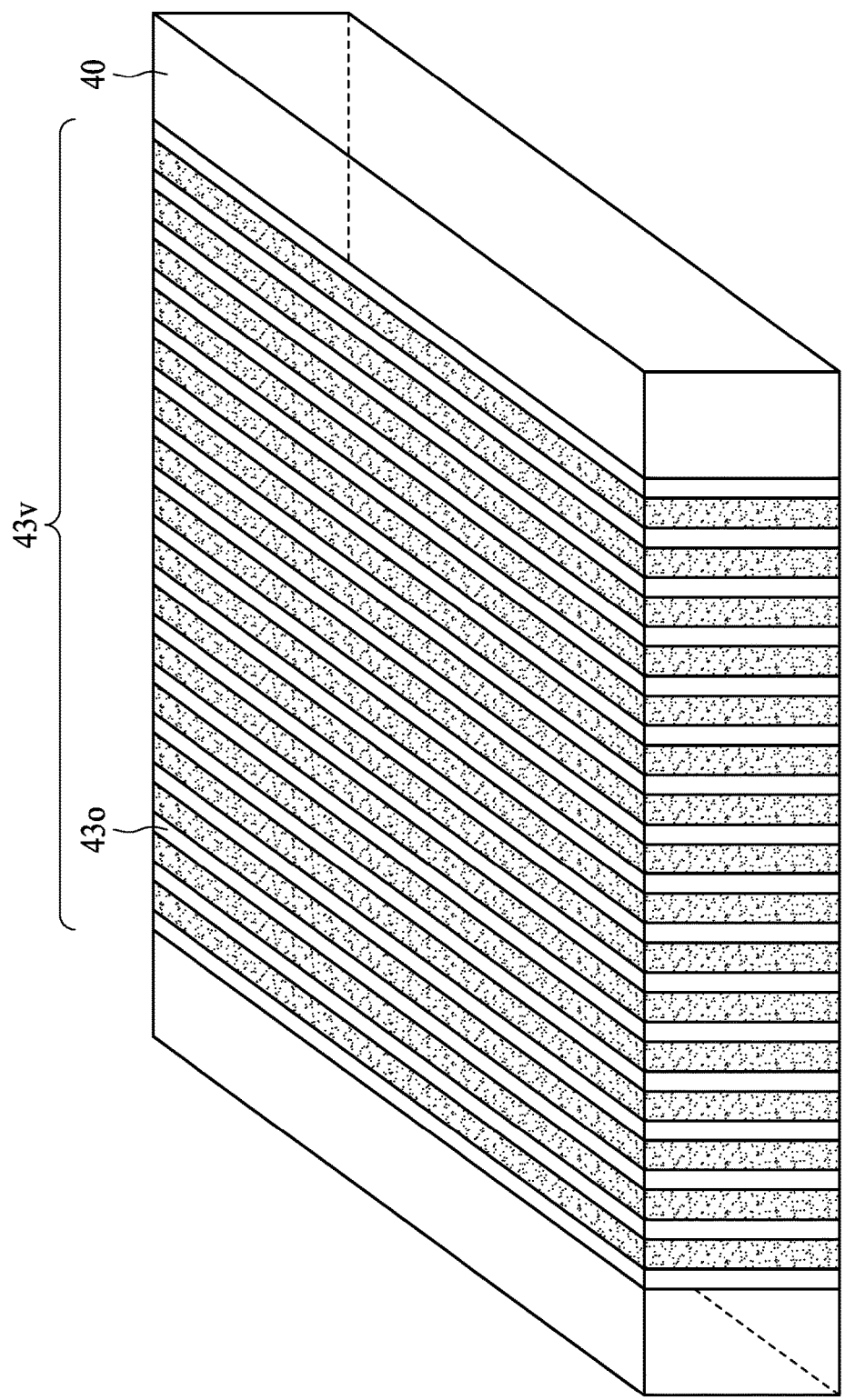

Referring to FIG. 4B, a bonding wire 43v is coiled around the carrier 40 to form a conductive coil. As shown in FIG. 43, which illustrates a three-dimensional view of FIG. 4B, the bonding wire is coiled around the top surface, the lateral surfaces and the bottom surface of the carrier 40. In other words, the bonding wire 43v forms a conductive coil around the carrier 40. In some embodiments, the bonding wire 43v is coiled around the carrier 40 by, for example, a reeling machine. In some embodiments, the bonding wire may be formed of Cu, Ag, Al, Au or other suitable metals or alloys.

In some embodiments, the bonding wire 43v has an oxide layer 43o surrounding the periphery of the bonding wire 43v. The oxide layer 43o is used to provide electrical insulation between any two of adjacent laps of the bonding wire 43v. For example, a lap of bonding wire 43v1 is electrically isolated from its adjacent lap of bonding wire 43v2. In some embodiments, the oxide layer 43o is formed by applying oxygen to the conductive wire 43v to oxidize the conductive wire 43v. In some embodiments, the oxide layer 43o may include $Cu_xO_y$, $Ag_xO_y$, $Cr_xO_y$, $Al_xO_y$, or a combination of two or more thereof.

Figure 4C:
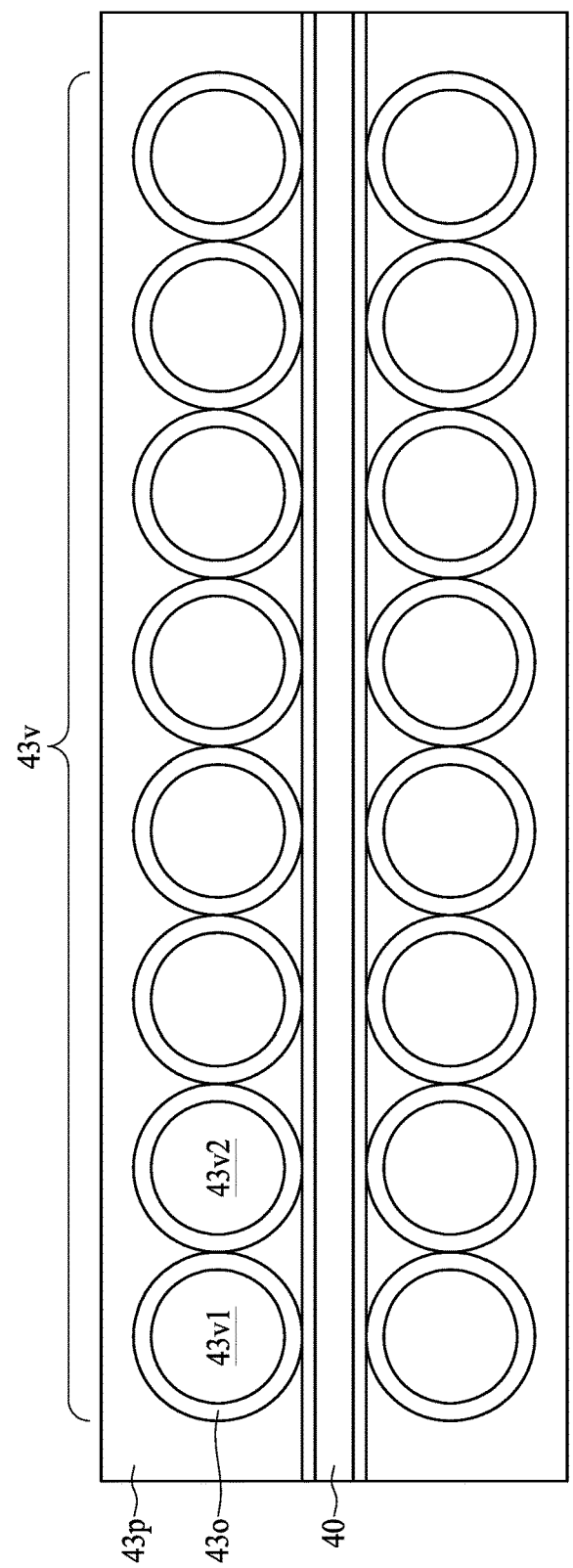
FIG. 4C illustrates a method for manufacturing a semiconductor package device at one or more stages in accordance with some embodiments of the present disclosure.

Referring to FIG. 4C, a package body 43p is formed on the carrier 40 to cover or encapsulate the bonding wire 43v. In some embodiments, the package body 43p may include an epoxy resin having fillers, a molding compound (e.g., an epoxy molding compound or other molding compound), a polyimide, a phenolic compound or material, a material with a silicone dispersed therein, or a combination of two or more thereof.

Figure 4D:
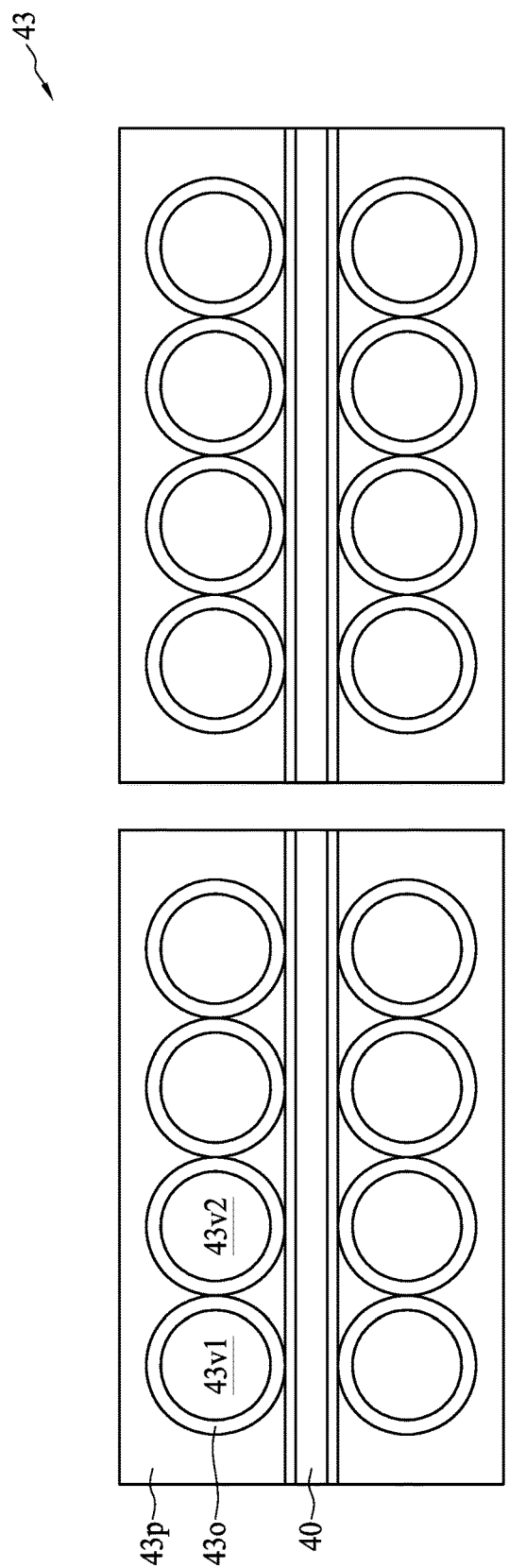
FIG. 4D illustrates a method for manufacturing a semiconductor package device at one or more stages in accordance with some embodiments of the present disclosure.
Figure 4D:
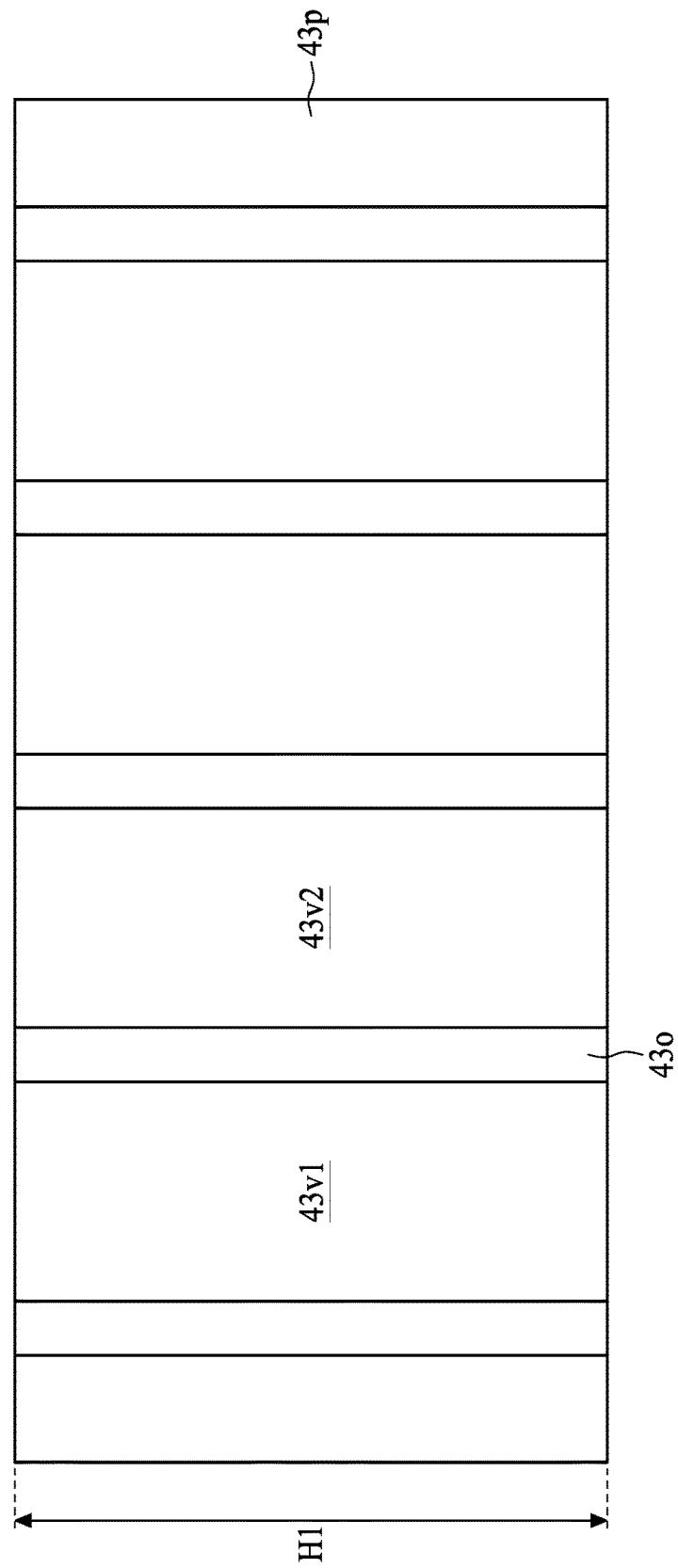

Referring to FIG. 4D, a singulation process may be performed. For example, the singulation process may be performed through the package body 43p, the bonding wire 43v, the oxide layer 43o and the carrier 40. The singulation process may be carried out, for example, by using a dicing saw, laser or other appropriate cutting technique. After singulation process, the semiconductor package structure shown in FIG. 4C is divided into a plurality of semiconductor package structures 43 as shown in FIG. 4D and FIG. 4D' (which illustrates a cross-sectional view of the semiconductor package structure 43 in FIG. 4D). In some embodiments, the semiconductor package structure 43 may be the same as or similar to the interposer 13" as shown in FIG. 1D. In the semiconductor package structure 43, the individual conductive wires 43v1, 43v2 are insulated from each other.

Referring to FIG. 4E, the carrier 40 is removed to form the semiconductor package structure 43'. In some embodiments, the semiconductor package structure 43' may be the same as or similar to the interposer 13 shown in FIG. 1B. In some embodiments, the release film 40h is a thermal release film, and the carrier 40 can be removed by, e.g., heating the semiconductor package structure shown in FIG. 4C or FIG. 4D. In some embodiments, no release film is used, and thus the carrier 40 can be removed by, e.g., grinding.

As mentioned above, with respect to the interposer formed by the manufacturing methods shown in FIGS. 2A-2D and 3A-3D, the conductive wires of the interposer may become distorted (or even broken) during a process of injecting the molding compound to form the package body. In accordance with the embodiments shown in FIGS. 4A-4E, since the bonding wire 43v is tightly arranged on the carrier 40, the bonding wire 43v may not be deformed when forming the package body 43p. Therefore, as shown in FIG. 4D', the conductive wires 43v1, 43v2 may be substantially perpendicular to the top surface and the bottom surface of the package body 43p.

In addition, because the bonding wires are relatively thin, the height of the bonding wires of the interposer formed by the manufacturing method shown in FIGS. 2A-2D and 3A-3D may be specified within a range. In accordance with the embodiments shown in FIGS. 4A-4E, the height $H_1$ (e.g., the thickness of the interposer 43) of the conductive wires 43v1, 43v2 shown in FIG. 4D' can be readily adjusted by changing the size of the carrier 40. Therefore, it is streamlined to form an interconnection structure (compared to the conductive pillar and the interposer formed by the manufacturing method shown in FIGS. 2A-2D and 3A-3D) with a thickness greater than, e.g., about 100 μm, about 150 μm, about 200 μm, or about 300 μm, and the manufacturing cost can be reduced.

Figure 5A:
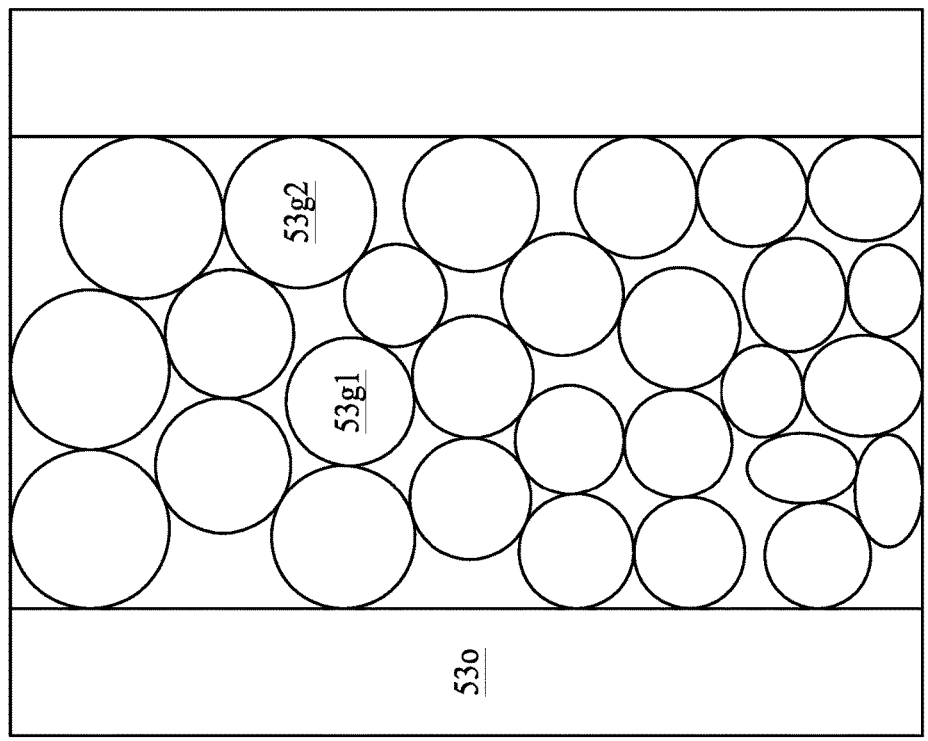
FIG. 5A illustrates a micro structure of a conductive wire in accordance with some embodiments of the present disclosure.

FIG. 5A illustrates a micro structure of a conductive wire 53v without elongation in accordance with some embodiments of the present disclosure. The conductive wire 53v is encapsulated by an oxide layer 53o. In some embodiments, the conductive wire 53v may be the bonding wires 23v shown in FIGS. 2A-2D or the bonding wires 33v1, 33v2 shown in FIGS. 3A-3D. As shown in FIG. 5A, since the conductive wire 53v is not elongated or stretched, the size or the shape of the grains of the conductive wire 53v are substantially uniform. For example, a dimension of a grain 53g1 of the conductive wire 53v adjacent to a center area of the conductive wire 53v is substantially the same as a dimension of a grain 53g2 of the conductive wire 53v adjacent to a peripheral area of the conductive wire 53v.

Figure 5B:
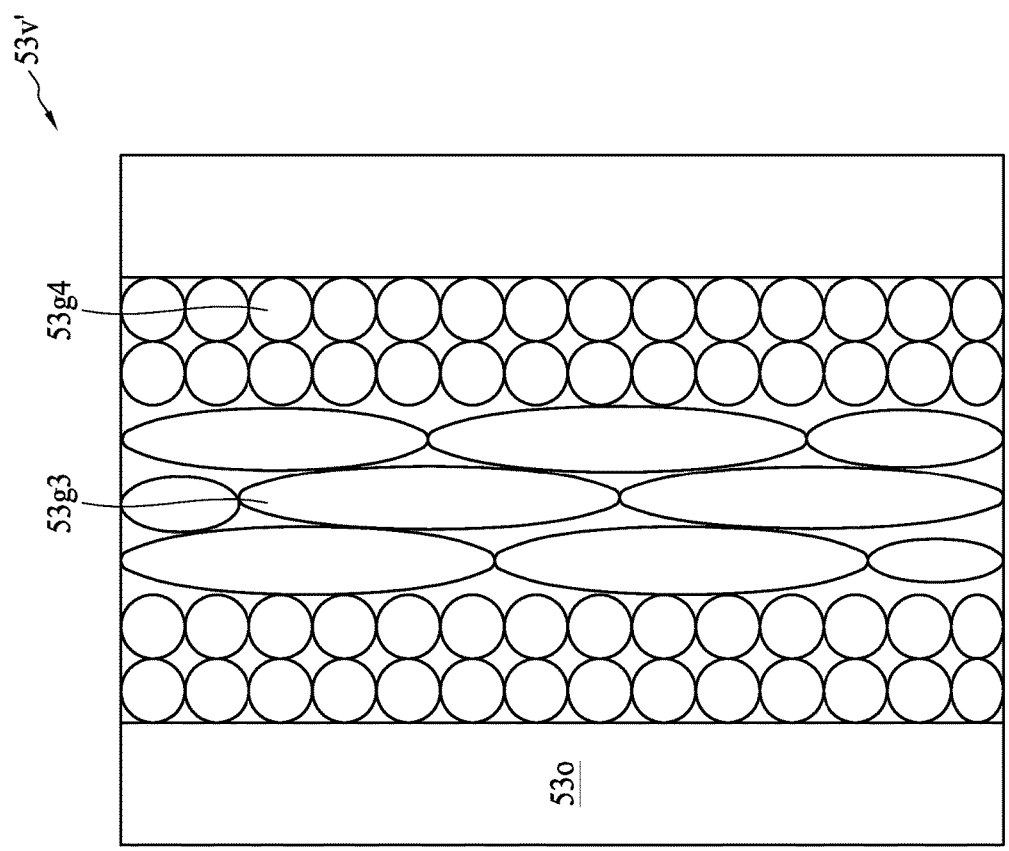
FIG. 5B illustrates a micro structure of a conductive wire in accordance with some embodiments of the present disclosure.

FIG. 5B illustrates a micro structure of a conductive wire 53v' after being elongated or stretched in accordance with some embodiments of the present disclosure. The conductive wire 53v' is encapsulated by an oxide layer 53o. In some embodiments, the conductive wire 53v' may be the conductive wires 13v1, 13v2, 13v3, 13v4, 43v (including 43v1, 43v2) shown in FIGS. 1A-1F and 4B-4E. Since the conductive wires 13v1, 13v2, 13v3, 13v4, 43v (including 43v1, 43v2) are coiled on the carrier, the conductive wires 13v1, 13v2, 13v3, 13v4, 43v (including 43v1, 43v2) would be elongated or stretched. As shown in FIG. 5B, the size or the shape of the grains of the conductive wire 53v' may not be uniform. For example, a dimension of a grain 53g3 of the conductive wire 53v' adjacent to a center area of the conductive wire 53v' is greater than a dimension of a grain 53g4 of the conductive wire 53v' adjacent to a peripheral area of the conductive wire 53v'. In some embodiments, the grain 53g3 adjacent to a center area of the conductive wire 53v' is ellipsoidal while the grain 53g4 adjacent to the peripheral area of the conductive wire 53v' is substantially spherical. A ratio of a major axis to a minor axis of the grain 53g3 (or aspect ratio) is greater than a ratio of a major axis to a minor axis of the grain 53g4. In some embodiments, the ratio of the major axis to the minor axis of the grain 53g3 is greater than about 1, such as about 1.5 or greater, or about 2 or greater, while the ratio of the major axis to the minor axis of the grain 53g4 is about 1.

In some embodiments, the disclosed semiconductor package device (e.g., the semiconductor package device 1 as illustrated in FIG. 1A) may be fabricated by depositing various layers and components on top of one or more semiconductor dies. FIGS. 6A, 6B, 6C, 6D, 6E and 6F illustrate cross-sectional views of a semiconductor structure fabricated at various stages, in accordance with some embodiments of the present disclosure. Various figures may have been simplified for a better understanding of the aspects of the present disclosure.

Figure 6A:
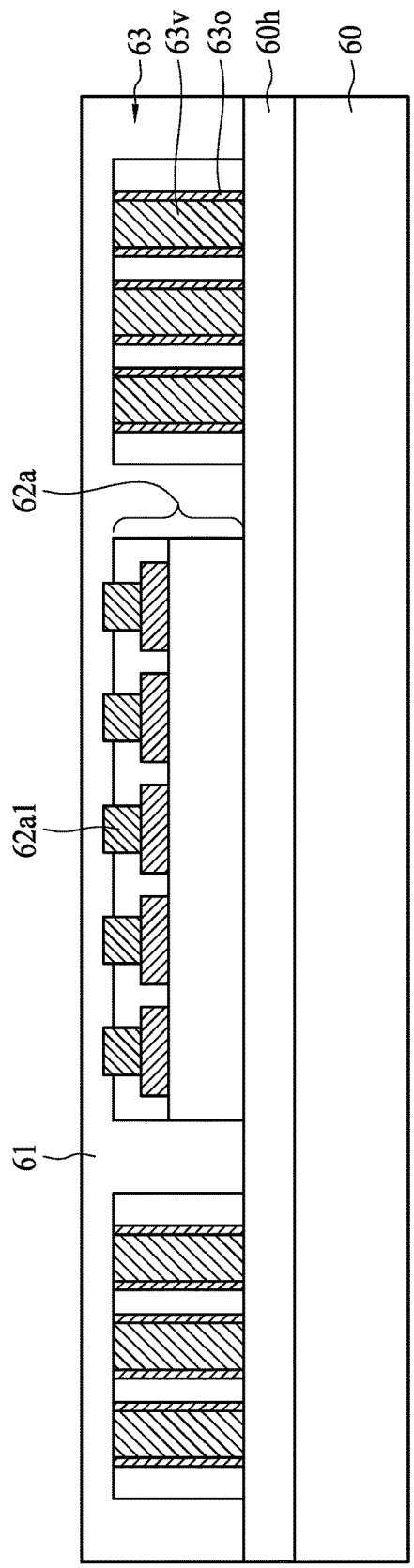
FIG. 6A illustrates a method for manufacturing a semiconductor package device at one or more stages in accordance with some embodiments of the present disclosure.

Referring to FIG. 6A, a carrier 60 with an adhesive 60h (e.g., a tape) thereon is provided. An electronic component 62a is attached to the carrier 60 through the adhesive 60h to facilitate the subsequent processes. A back surface of the electronic component 62a is attached to the carrier 60.

The electronic component 62a may be an active component, such as an IC chip or a die. For example, the chip or the die may include a semiconductor substrate, one or more integrated circuit devices and one or more overlying interconnection structures therein. The integrated circuit devices may include active devices such as transistors and/or passive devices such resistors, capacitors, inductors, or a combination of two or more thereof. In some embodiments, the electronic component 62a may be an ASIC.

The interposer 63 is placed on the carrier 60. In some embodiments, the interposer 63 can be any of the interposers 13, 13', 13", 13''' as shown in FIGS. 1B-1E. In some embodiments, the interposer 63 can be manufactured by any of the manufacturing methods shown in FIGS. 2A-2D, 3A-3D and 4A-4E.

A package body 61 is formed on the carrier 60 to cover or encapsulate the electronic component 62a (including conductive contacts 62a1) and the interposer 63. In some embodiments, the package body 61 may include an epoxy resin having fillers, a molding compound (e.g., an epoxy molding compound or other molding compound), a polyimide, a phenolic compound or material, a material with a silicone dispersed therein, or a combination of two or more thereof.

Figure 6B:
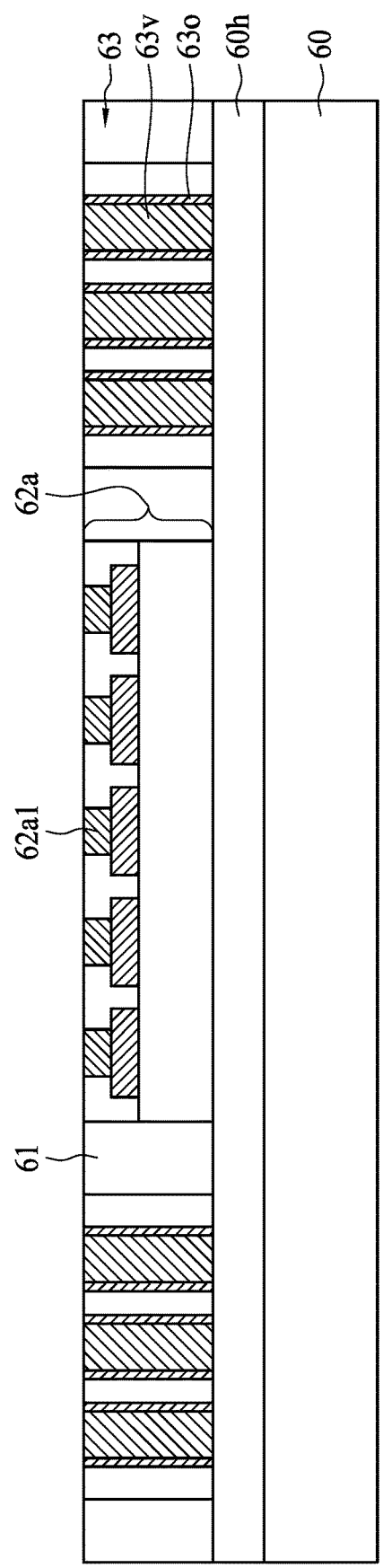
FIG. 6B illustrates a method for manufacturing a semiconductor package device at one or more stages in accordance with some embodiments of the present disclosure.

Referring to FIG. 6B, a portion of the package body 61 is removed to expose the interposer 63 and conductive contacts 62a1 of the electronic component 62a. In some embodiments, the package body 61 can be removed by, e.g., grinding or chemical-mechanical planarization (CMP) technique.

Figure 6C:
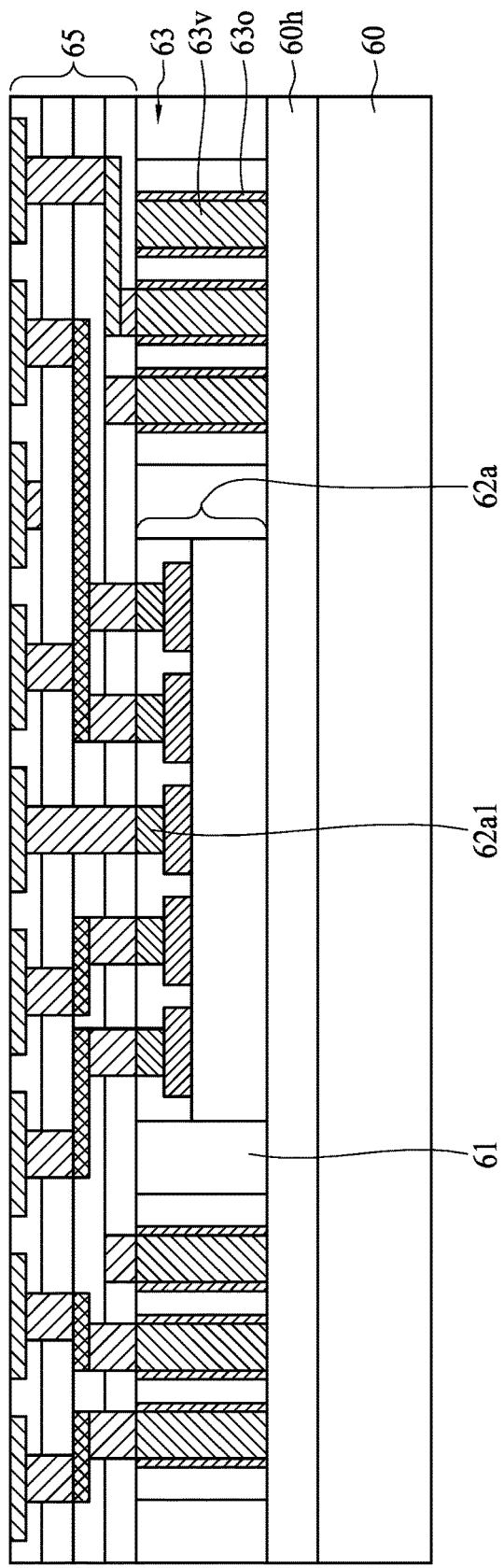
FIG. 6C illustrates a method for manufacturing a semiconductor package device at one or more stages in accordance with some embodiments of the present disclosure.

Referring to FIG. 6C, an interconnection layer 65 is formed on package body 61 and electrically connected with the exposed portion of the interposer 63 and the conductive contacts 62a1 of the electronic component 62a. The interconnection layer 65 may include multiple redistribution layers (RDLs), each of which is encapsulated by a dielectric layer or a passivation layer. In some other embodiments, the interconnection layer 65 may include one RDL encapsulated by a dielectric layer or a passivation layer.

Figure 6D:
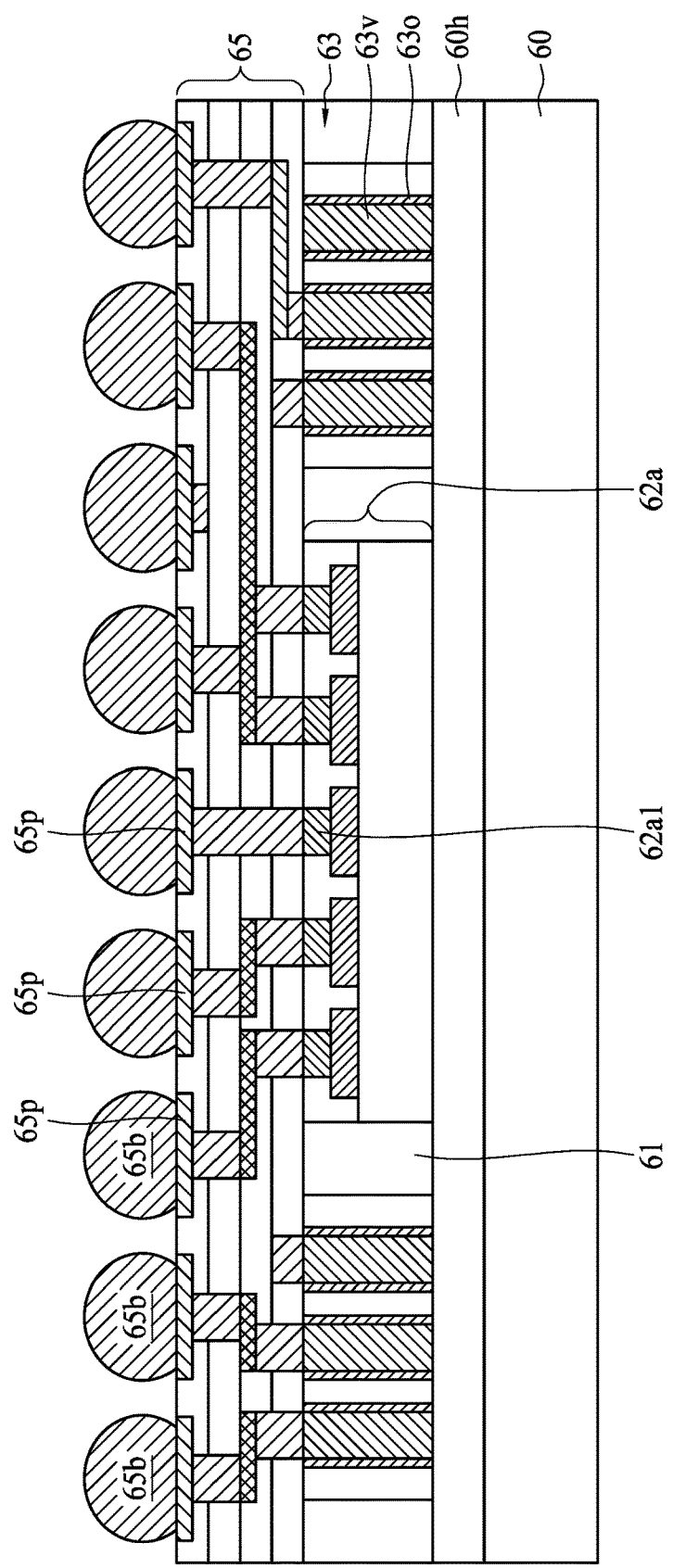
FIG. 6D illustrates a method for manufacturing a semiconductor package device at one or more stages in accordance with some embodiments of the present disclosure.

Referring to FIG. 6D, electrical contacts 65b (such as Controlled Collapse Chip Connection (C4) pads) are placed on the conductive pads 65p on the interconnection layer 65.

Figure 6E:
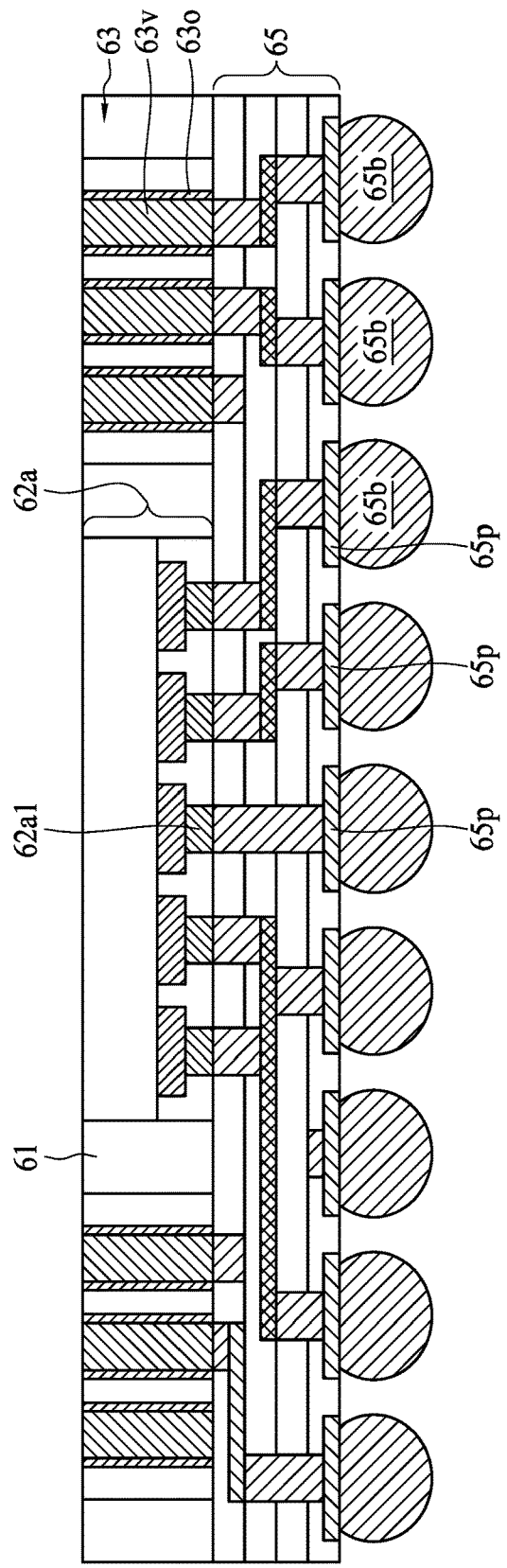
FIG. 6E illustrates a method for manufacturing a semiconductor package device at one or more stages in accordance with some embodiments of the present disclosure.

Referring to FIG. 6E, the carrier 60 is removed to expose another side of the interposer 63 and the back surface of the electronic component 23a. Then, the semiconductor package structure is inverted.

Figure 6F:
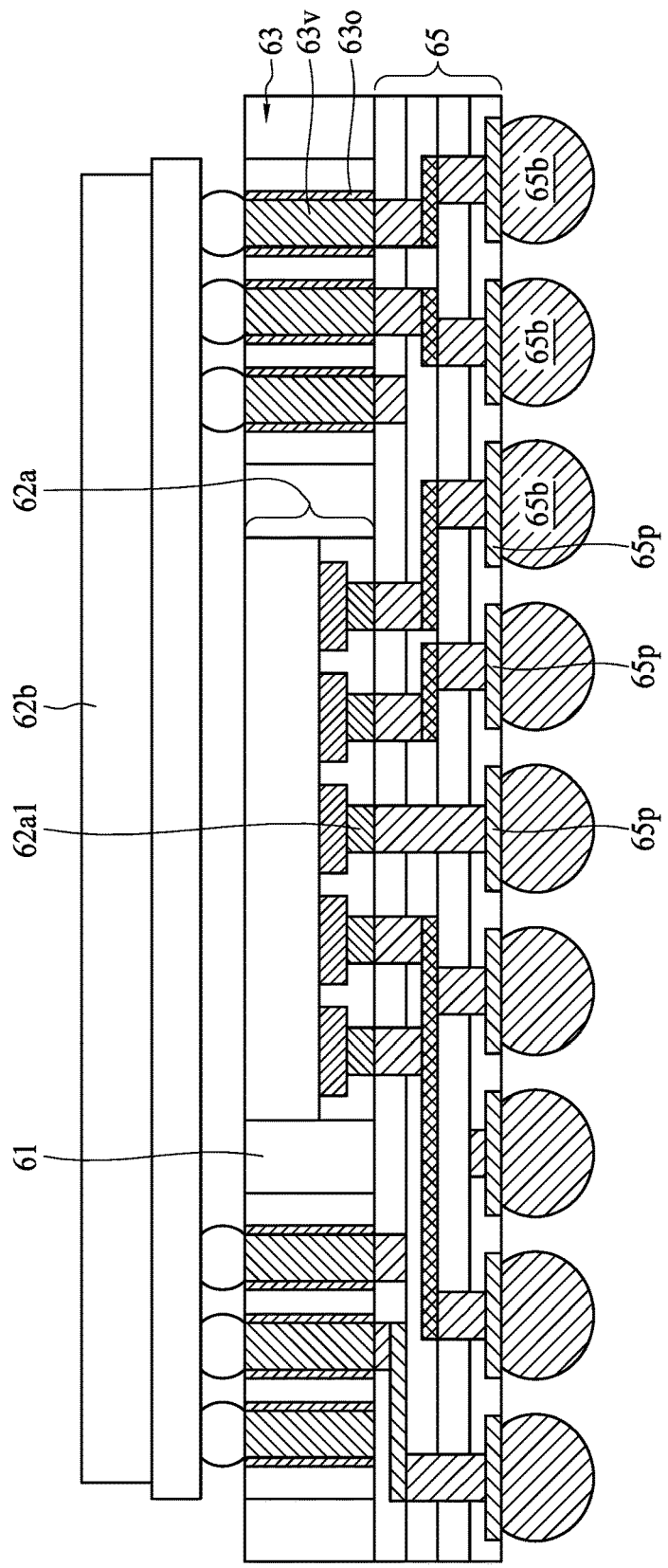
FIG. 6F illustrates a method for manufacturing a semiconductor package device at one or more stages in accordance with some embodiments of the present disclosure.

Referring to FIG. 6F, an electronic component 62b is disposed on the package body 61 and electrically connected to the exposed portion of the interposer 63. The electronic component 62b may be an active component, such as an IC chip or a die. For example, the chip or the die may include a semiconductor substrate, one or more integrated circuit devices and one or more overlying interconnection structures therein. The integrated circuit devices may include active devices such as transistors and/or passive devices such resistors, capacitors, inductors, or a combination of two or more thereof. In some embodiments, the electronic component 62b may be, e.g., a memory chip.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An interposer, comprising:
   a first conductive wire having a first terminal and a second terminal;
   a first oxide layer covering the first conductive wire and exposing the first terminal and the second terminal of the first conductive wire;
   an encapsulant covering the first oxide layer and exposing the first terminal and the second terminal of the first conductive wire;
   a second conductive wire adjacent to the first conductive wire; and
   a second oxide layer covering the second conductive wire, wherein
   the first conductive wire and the second conductive wire are electrically insulated by the first oxide layer and the second oxide layer, and the first oxide layer directly contacts the second oxide layer.

2. The interposer of claim 1, further comprising a substrate, wherein the first conductive wire is adjacent to a first surface of the substrate.

3. The interposer of claim 2, further comprising a third conductive wire adjacent to a second surface of the substrate that is opposite to the first surface of the substrate.

4. The interposer of claim 1, wherein a dimension of a grain of the first conductive wire adjacent to a center of the first conductive wire is different from a dimension of a grain of the first conductive wire adjacent to a periphery of the first conductive wire.

5. The interposer of claim 1, wherein the first conductive wire comprises a first conductive material, and wherein the first oxide layer comprises an oxide of the first conductive material.

6. The interposer of claim 1, wherein a ratio of a major axis to a minor axis of a grain of the first conductive wire adjacent to a center of the first conductive wire is greater than a ratio of a major axis to a minor axis of a grain of the first conductive wire adjacent to a periphery of the first conductive wire.

7. A semiconductor package device, comprising:
   a substrate;
   an electronic component on the substrate; and
   an interposer between the substrate and the electronic component and electrically connecting the electronic component with the substrate, wherein the interposer comprises:
   a plurality of conductive wires electrically insulated from one another;
   a package body encapsulating the plurality of conductive wires and exposing a portion of each of the plurality of conductive wires, the package body having a first surface and a second surface opposite to the first surface, wherein at least one of the plurality of conductive wires is substantially perpendicular to the first surface of the package body; and
   a plurality of insulation layers, each of the plurality of insulation layers covering a corresponding one of the plurality of conductive wires, wherein at least two adjacent insulation layers of the plurality of insulation layers are in direct contact with each other.

8. The semiconductor package device of claim 7, wherein the plurality of conductive wires comprise a first conductive material, and wherein the plurality of insulation layers comprise an oxide of the first conductive material.

9. The semiconductor package device of claim 7, wherein the plurality of conductive wires are arranged in a staggered pattern.

10. The semiconductor package device of claim 7, wherein the interposer further comprises a substrate adjacent to the plurality of conductive wires.

11. The semiconductor package device of claim 7, wherein a ratio of a major axis to a minor axis of a grain adjacent to a center of one of the plurality of conductive wires is greater than a ratio of a major axis to a minor axis of a grain adjacent to a periphery of the one of the plurality of conductive wires.

12. The semiconductor package device of claim 7, wherein a dimension of a grain adjacent to a center of one of the plurality of conductive wires is different from a dimension of a grain adjacent to a periphery of the one of the plurality of conductive wires.

13. The interposer of claim 1, wherein a portion of the first terminal exposed from the encapsulant is substantially coplanar with a surface of the encapsulant and a portion of the second terminal exposed from the encapsulant is substantially coplanar with an opposite surface of the encapsulant.

14. The interposer of claim 1, wherein a length of the first conductive wire is substantially equal to a thickness of the encapsulant.

15. The interposer of claim 4, wherein the dimension of the grain of the first conductive wire adjacent to the center of the first conductive wire is greater than the dimension of the grain of the first conductive wire adjacent to the periphery of the first conductive wire.

16. The interposer of claim 4, wherein the grain of the first conductive wire adjacent to the center of the first conductive wire is ellipsoidal and the grain of the first conductive wire adjacent to the periphery of the first conductive wire is substantially spherical.

17. The semiconductor package device of claim 7, wherein the portion of each of the plurality of conductive wires exposed from the package body is substantially coplanar with the first surface of the package body.

18. The semiconductor package device of claim 7, wherein a length of each of the plurality of conductive wires is substantially equal to a thickness of the package body.

19. The semiconductor package device of claim 12, wherein the dimension of the grain adjacent to the center of one of the plurality of conductive wires is greater from the dimension of the grain adjacent to the periphery of the one of the plurality of conductive wires.

20. The semiconductor package device of claim 12, wherein the grain adjacent to the center of one of the plurality of conductive wires is ellipsoidal and the grain adjacent to the periphery of the one of the plurality of conductive wires is substantially spherical.

* * * * *